United States Patent
Lui et al.

[11] Patent Number: 5,879,991
[45] Date of Patent: Mar. 9, 1999

[54] TRENCH FREE POLYSILICON GATE DEFINITION PROCESS FOR A NON-VOLATILE MEMORY DEVICE

[75] Inventors: Hon-Hung Lui; Shou-Yi Shiu, both of Hsin-Chu, Taiwan

[73] Assignee: Taiwan Semiconductor Manufacturing Company, Ltd., Hsin-Chu, Taiwan

[21] Appl. No.: 984,841

[22] Filed: Dec. 4, 1997

[51] Int. Cl.[6] .............................................. H01L 21/8247
[52] U.S. Cl. ........................................... 438/261; 438/257
[58] Field of Search .................. 438/257–267; 257/316

[56] References Cited

U.S. PATENT DOCUMENTS

| | | | |
|---|---|---|---|
| 4,892,840 | 1/1990 | Esquivel et al. | 257/316 |
| 5,480,819 | 1/1996 | Huang . | |
| 5,506,160 | 4/1996 | Chang | 437/43 |
| 5,633,185 | 5/1997 | Yiu et al. | 438/258 |
| 5,643,814 | 7/1997 | Chung | 437/43 |
| 5,723,351 | 3/1998 | Bellezza . | |

*Primary Examiner*—Richard A. Booth
*Attorney, Agent, or Firm*—George O. Saile; Stepehen B. Ackerman

[57] ABSTRACT

A method of creating a non-volatile memory device, featuring self-alignment of a control gate structure, to an underlying floating gate structure, has been developed. The formation of a first polysilicon floating gate shape, completely covering the semiconductor substrate, with openings only to underlying field oxide regions, prevents a deleterious trenching phenomena from occurring during a subsequent patterning, used to define an overlying, control gate structure. A photoresist shape is used as a mask to allow patterning of the control gate structure to be performed, via an anisotropic procedure, applied to a polysilicon layer, followed by the continuation of the anisotropic RIE procedure, applied to the first polysilicon floating gate shape, creating the floating gate structure.

16 Claims, 5 Drawing Sheets

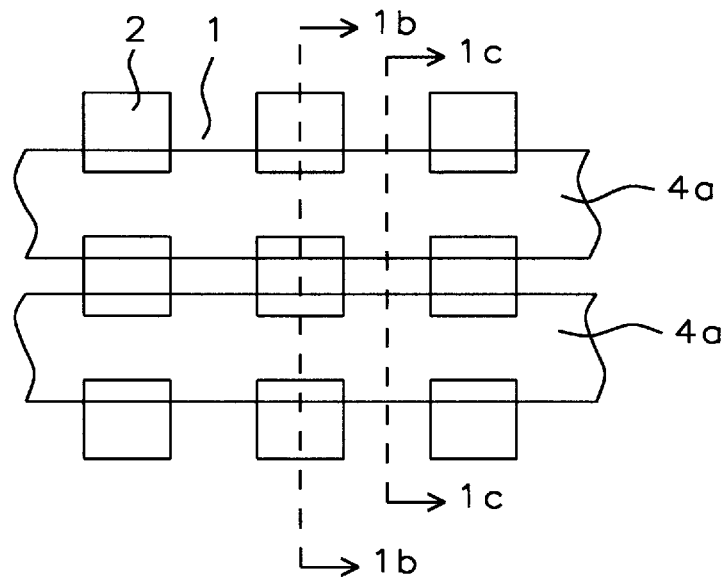
FIG. 1a – Prior Art
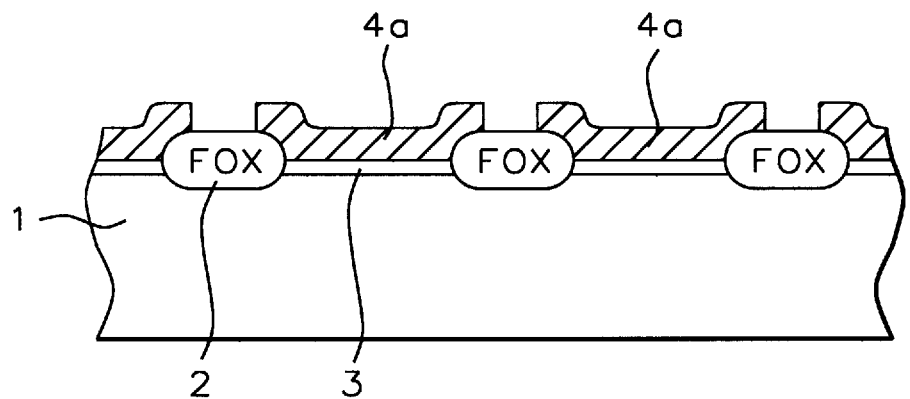
FIG. 1b – Prior Art
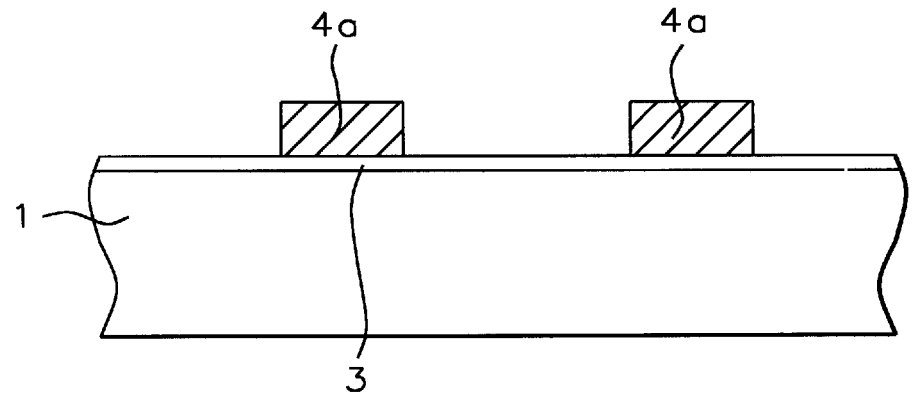
FIG. 1c – Prior Art

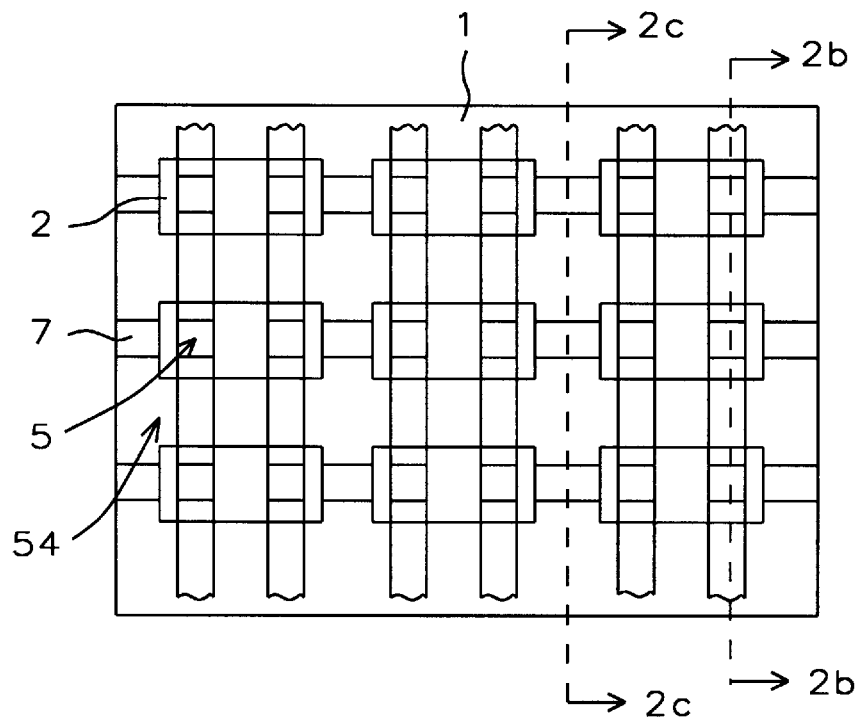
FIG. 2a – Prior Art
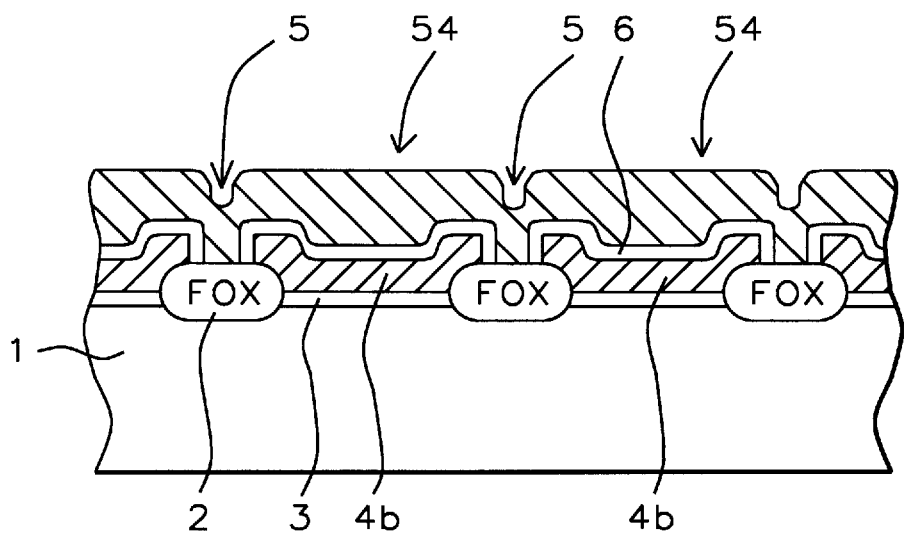
FIG. 2b – Prior Art

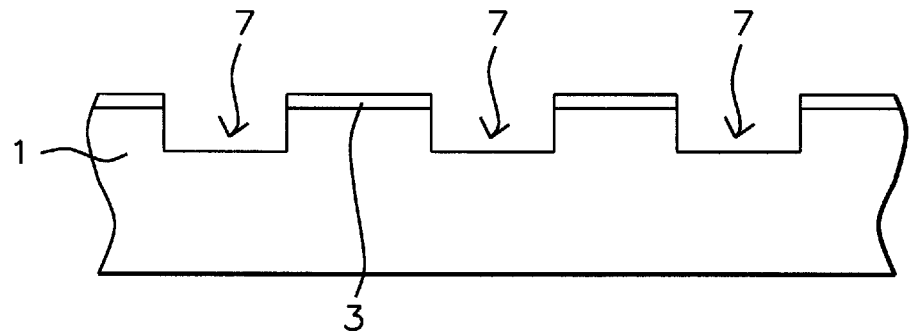
FIG. 2c - Prior Art
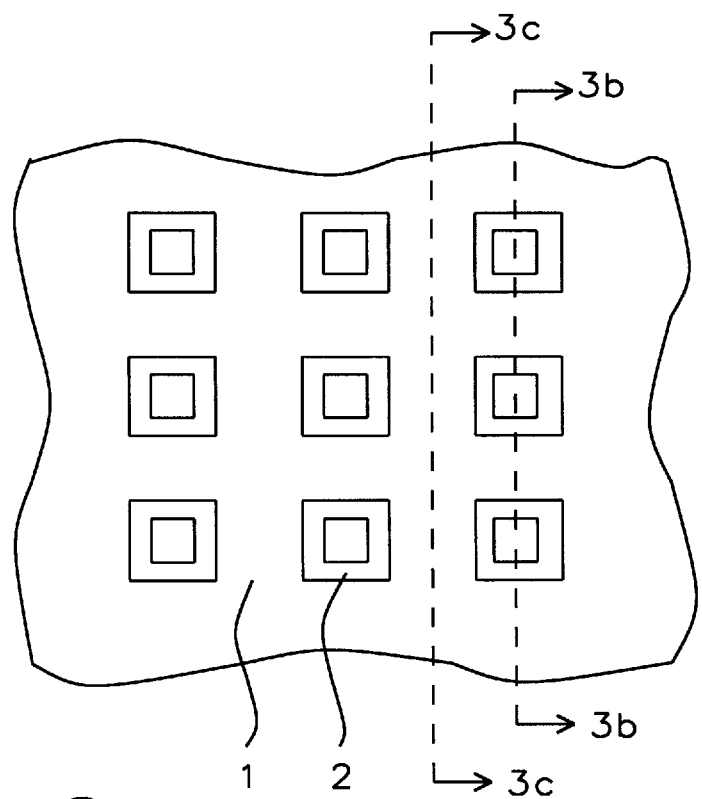
FIG. 3a

TRENCH FREE POLYSILICON GATE DEFINITION PROCESS FOR A NON-VOLATILE MEMORY DEVICE

BACKGROUND OF THE INVENTION (1) Field of the Invention

The present invention relates to processes used to fabricate semiconductor devices, and more specifically to a process used to fabricate a non-volatile memory device.

(2) Description of the Prior Art

Non-volatile memory devices, such as Electrical Erasable Programmable Read Only Memory, (EEPROM), or Erasable Programmable read Only Memory, (EPROM), devices, offer the desirable features of programming, reading, and erasing, via use of only specific biasing procedures. One form of these devices, is comprised of a "split gate" electrode configuration, in which the control gate overlies all, or a portion of an underlying floating gate, and overlies a portion of the channel region. The use of the split gate electrode configuration can however result in the formation of trenches, in an active device region of the non-volatile memory device, during the formation of the polysilicon control gate structure. For example if a self-aligned, control gate to floating gate configuration is desired, the final pattern for the underlying polysilicon floating gate structure, is defined during the polysilicon control gate patterning. This procedure can result in unwanted trenches in active regions of the semiconductor substrate, in regions in which the polysilicon control gate structure, does not overlay the polysilicon floating gate structure. The additional etching time, needed to define the combination of gates, in regions in which the control gate overlays the floating gate, can result in undesirable trench formation, in regions in which the gates do not overlay.

This invention will describe a reactive ion etching, (RIE), patterning procedure, allowing successful self-alignment, simultaneously forming the entire polysilicon control gate, and a final definition of an underlying polysilicon floating gate structure, without degradation to active device regions, in areas not covered by either gate structure. This is achieved using a unique, initial, polysilicon floating gate layout. Prior art, such as Chung, in U.S. Pat. No. 5,643,814, describe a method of forming an EEPROM device, however without the simultaneous definition of both gate structures.

SUMMARY OF THE INVENTION

It is an object of this invention to fabricate a non-volatile memory device, via self-aligning a control gate structure, to an underlying floating gate structure.

It is another object of this invention to initially form a first shape, for a polysilicon floating gate structure, using a unique, initial photolithographic mask layout, and a polysilicon RIE procedure.

It is still another object of this invention to define the polysilicon control gate structure, and the final shape of the underlying polysilicon floating gate structure, using a second photolithographic mask layout, and a RIE procedure.

In accordance with the present invention a method of creating a non-volatile memory device, featuring self-alignment of the control and floating gate structures, using an initial photolithographic mask layout for the definition of an initial polysilicon floating gate shape, followed by a photolithographic and RIE procedure allowing the simultaneous definition of both gate structures, is described. After creation of field oxide, (FOX), regions, in a semiconductor substrate, a gate oxide layer is grown. A first polysilicon layer is then deposited and patterned, to create a first polysilicon floating gate shape. The first polysilicon floating gate shape, formed using a first photolithographic mask, and RIE procedure, is comprised of a blanket polysilicon layer, with openings exposing a portion of underlying FOX regions. After creation of an insulator layer on the top surface of, as well as the sides of, the first polysilicon floating gate shape, a second polysilicon layer is deposited. A patterning procedure, comprised of a second photolithographic mask, and RIE procedure, is used to create the polysilicon control gate structure, while also forming the underlying, final polysilicon floating gate structure, self-aligned to the overlying polysilicon control gate structure.

BRIEF DESCRIPTION OF THE DRAWINGS

The object and other advantages of this invention are best described in the preferred embodiment with reference to the attached drawings that include:

FIGS. 1a–1c, and FIGS. 2a–2c, which schematically describe prior art, and the formation of unwanted trenches in a semiconductor substrate, during a RIE procedure used to self-align the control gate and floating gate structures.

FIGS. 3a–3c, and FIGS. 4a–4c, which schematically describe the formation of self-aligned gate structures, in a non-volatile memory device, formed without the creation of unwanted trenches, via the use of a unique, initial polysilicon floating gate shape.

DESCRIPTION OF THE PREFERRED EMBODIMENTS

Figure 3B:
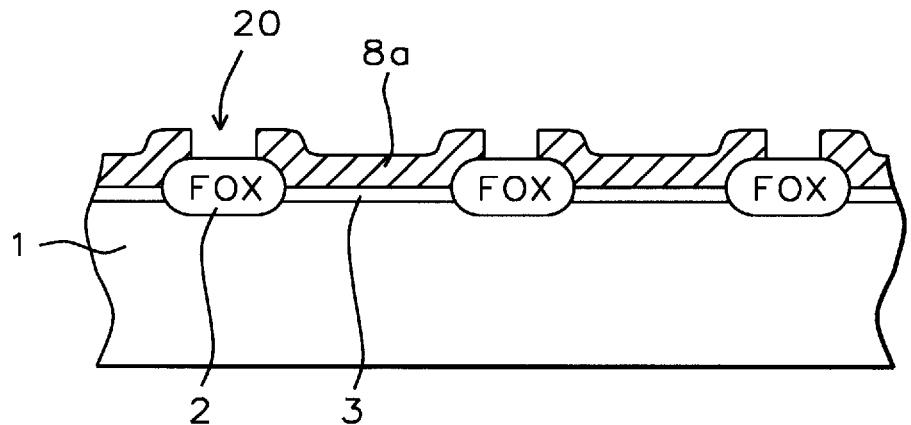

The method of fabricating a non-volatile memory device, featuring self-alignment between the control gate and the underlying floating gate structures, and using a unique, first polysilicon floating gate shape, to avoid trenching during a subsequent RIE procedure, will now be described in detail. This invention can be used for non-volatile, EEPROM or EPROM devices now being manufactured in industry, therefore only the specific areas, unique to this invention, will be detailed. This invention will be described using an N channel type, MOSFET device. However this invention can also be accomplished for a P channel type, MOSFET device, via use of an N well region, P type source and drain regions.

FIGS. 1a–1c, and FIGS. 2a–2c, describe prior art and an unwanted trenching phenomena, occurring during a RIE procedure, performed to create a polysilicon control gate structure, self-aligned to an underlying polysilicon floating gate structure. FIG. 1a, schematically shows the top view of an non-volatile memory device, after formation of a first polysilicon floating gate shape. A P type, semiconductor substrate 1, comprised of single crystalline silicon with a <100> crystallographic orientation, is used. Field oxide 2, (FOX), regions are formed via thermal oxidation of semiconductor substrate 1, in an oxygen-stream ambient, to a thickness between about 3200 to 4800 Angstroms. Unoxidized regions of semiconductor substrate 1, were protected by a masking pattern comprised of silicon nitride on an underlying pad oxide. The masking composite is formed by initially growing a pad silicon oxide layer, on semiconductor substrate 1, followed by the deposition of a silicon nitride layer. Conventional photolithographic and RIE procedures are used to form the masking silicon nitride-silicon oxide composite. After removal of the photoresist shape, FOX regions 2, are created, in regions of semiconductor substrate 1, not covered by the masking composite, followed by the removal of the masking composite via a hot phosphoric acid, for silicon oxide removal, and a buffered hydrofluoric acid solution for the pad silicon oxide removal. A gate insulator layer 3, of silicon dioxide, is thermally grown in an oxygen-stream ambient, at a temperature between about 825° to 875° C., to a thickness between about 75 to 125 Angstroms. A first polysilicon layer, is next deposited via low pressure chemical vapor deposition, (LPCVD), procedures, to a thickness between about 1000 to 1600 Angstroms. The polysilicon layer is deposited using an in situ doping procedure, via the addition of arsine or phosphine, to a silane ambient. Photolithographic and RIE procedures, using $Cl_2$ as an etchant for the first polysilicon layer, are used to create first polysilicon floating gate shape 4a, schematically shown in FIG. 1a. FIG. 1b, schematically shows the same non-volatile device, in a cross-sectional view, cutting through FOX regions 2, along the 1b—1b plane, while FIG. 1c, schematically shows a cross-sectional view of the non-volatile memory device, through an entire region to be used for the active device, along the 1c—1c plane.

FIGS. 2a, illustrates the top view of the prior art, non-volatile memory device, after formation of a polysilicon control gate structure, self-aligned to an underlying, polysilicon floating gate structure. After deposition of an insulator layer 6, (shown schematically in the cross-sectional representations, in FIG. 2b, and FIG. 2c), a second polysilicon layer is deposited using LPCVD procedures, to a thickness between about 1200 to 1800 Angstroms. The second polysilicon layer is doped using a $POCl_3$ process. A photolithographic and RIE procedure, using $CHF_3$ as an etchant for insulator layer 6, and using $Cl_2$ as an etchant for the second polysilicon layer, create polysilicon control gate structure 5, overlying FOX region 2, and the composite polysilicon gate structure 54, comprised of polysilicon control gate 5, self-aligned to, and overlying polysilicon floating gate structure 4b, where polysilicon floating gate structure 4b, (shown schematically in cross-sectional style in FIG. 2b, is formed during this RIE procedure, from first polysilicon floating gate shape 4a. When the RIE procedure used to define the composite gate structure 54, is applied to regions of the non-volatile memory device, not covered by first polysilicon floating gate shape 4a, an unwanted trench 7, is created in semiconductor substrate 1. This region is schematically shown in cross-sectional style, in FIG. 2c, along the 2c—2c plane. Subsequent formation of source and drain regions, partially residing in trench 7, would adversely influence the operation of the non-volatile memory device. FIG. 2b, schematically shows a cross-sectional view, along the 2b—2b plane, illustrating the formation of polysilicon control gate 5, on FOX region 2, and the composite polysilicon gate structure 54, comprised of the polysilicon control gate, overlying polysilicon floating gate structure 4b.

Figure 3C:
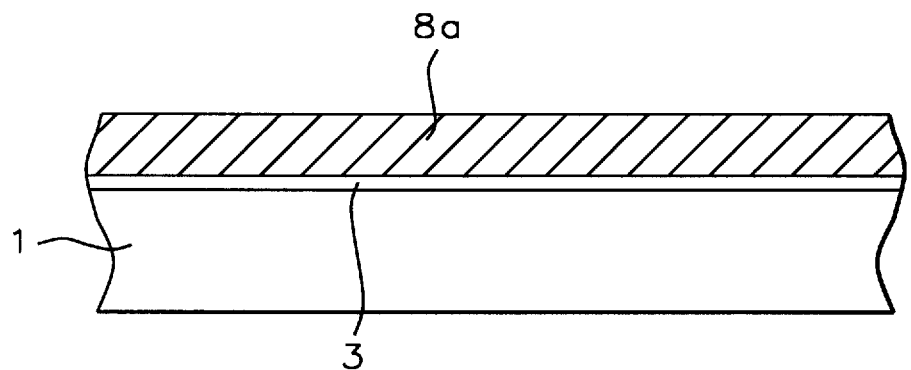
Figure 4A:
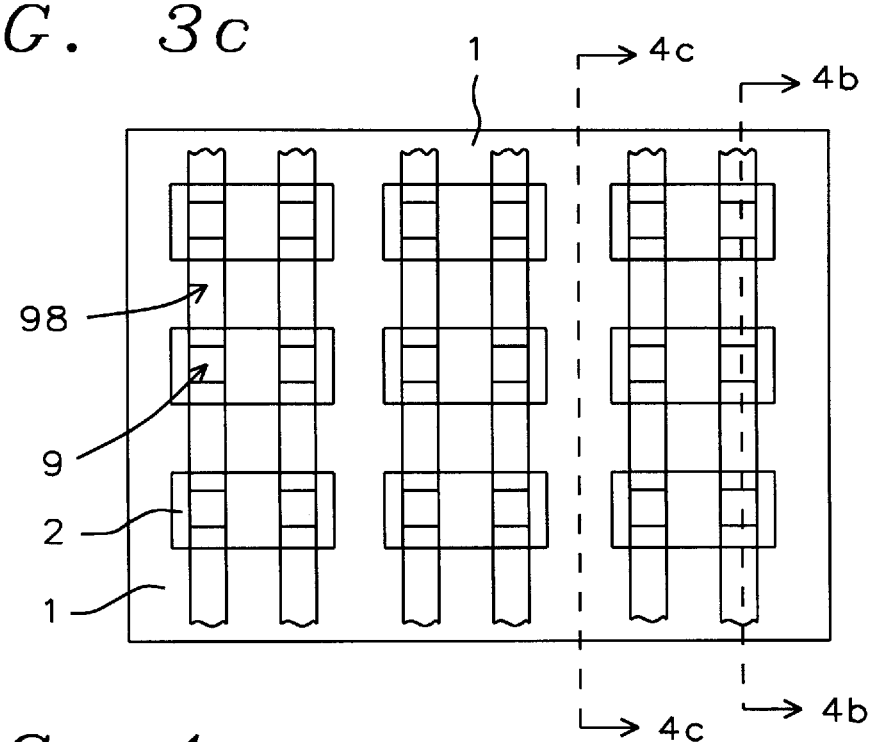
Figure 4B:
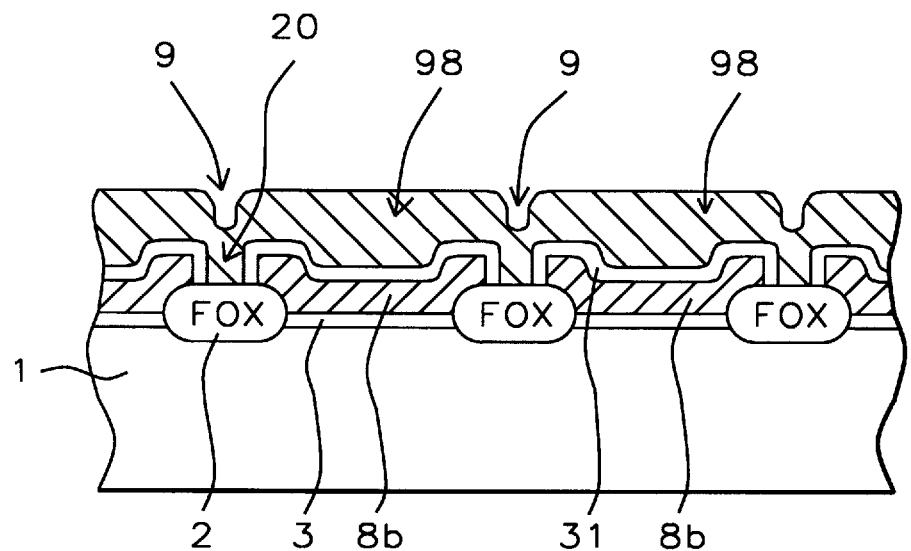
Figure 4C:
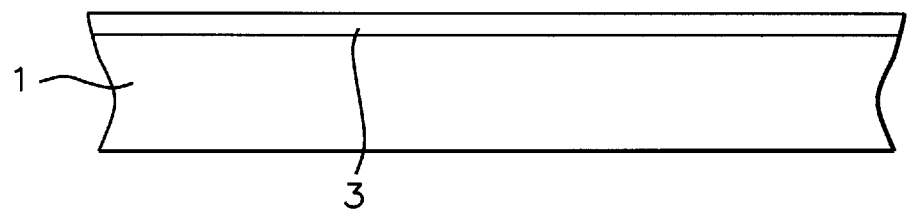

A process used to avoid the deleterious trench formation, in the semiconductor substrate, used for the non-volatile memory device, is presented schematically in FIGS. 3a–3c, and in FIGS. 4a–4c. A first polysilicon layer, is again deposited, identical in thickness and doping characteristics, to the first polysilicon layer used in FIG. 1a. However a unique masking pattern is used to create a first polysilicon floating gate shape 8a, schematically shown in FIG. 3a, the top view of the non-volatile memory device. Photolithographic procedures, using the unique masking pattern, and an anisotropic RIE procedure, using $Cl_2$ as an etchant, applied to the first polysilicon layer, results in a first floating gate shape featuring a continuous polysilicon layer with only openings 20, exposing a portion of the top surface of FOX regions 2. FIG. 3b, shows schematically, in cross-sectional style, shows this fabrication stage, along the 3b—3b plane, while FIG. 3c schematically shows, in cross-sectional style, this stage of fabrication, along the 3c—3c plane.

The procedure for creating the polysilicon control gate structure, self-aligned to an underlying polysilicon floating gate structure, is described in FIGS. 4a–4c. An insulator layer 21, (shown in FIG. 4b), of ONO, (Oxidized Silicon Nitride on Oxide, ($SiO_2$—$Si_3N_4$—$SiO_2$,) is formed via initial oxidation of the top surface of the underlying polysilicon floating gate structure, followed by the deposition of a $Si_3N_4$ layer, using either LPCVD or plasma enhanced chemical vapor deposition, (PECVD), procedures, and finally subjected to a thermal oxidation procedure, used to oxidize a top portion of the $Si_3N_4$ layer, creating ONO layer 21, at a thickness between about 180 to 220 Angstroms. A second polysilicon layer is deposited via LPCVD procedures, using a thickness and doping procedure, identical to the thickness and doping used for the second polysilicon layer, used and described for FIGS. 2a–2c. A photolithographic procedure, using the identical mask used and described in FIGS. 2a–2c, and using a RIE procedure, with $CHF_3$ as an etchant for insulator layer 21, and $Cl_2$ as an etchant for the second polysilicon layer, result in the creation of polysilicon control gate 9, overlying FOX region 2, in opening 20, and resulting in the formation of composite polysilicon gate structure 98, comprised of polysilicon control gate 9, overlying, and self-aligned to polysilicon floating gate structure 8b, where polysilicon gate structure 8b, is formed from second polysilicon layer 8a. Removal of the masking photoresist shape is accomplished using plasma oxygen ashing and careful wet cleans. The cross-sectional views of the non-volatile memory device, at this stage of fabrication are illustrated in FIG. 4b, and FIG. 4c. Subsequent source and drain regions are formed via ion implantation procedures, in regions not covered by the composite polysilicon gate structures.

The formation of the unwanted, deleterious trench 7, shown with prior art, in FIGS. 2a–2c, did not occur as a result of using the unique mask for creation of the first polysilicon floating gate shape. The use of this first polysilicon floating gate shape, did not allow excessive exposure of the semiconductor substrate, during the composite polysilicon gate structure patterning procedure, thus avoiding formation of the unwanted trench. Subsequent source and drain formation can now be created in a non-trenched, semiconductor substrate.

While this invention has been particularly shown and described with reference to, the preferred embodiments thereof, it will be understood by those skilled in the art that various changes in form and detail may be made without departing from the spirit and scope of this invention.

What is claimed is:

1. A method of fabricating a non-volatile memory device, on a semiconductor substrate, comprising the steps of:

forming field oxide regions in said semiconductor substrate;

growing a gate insulator layer on regions of said semiconductor substrate, not covered by said field oxide regions;

forming a first polysilicon floating gate shape completely covering the semiconductor substrate, comprised of a continuous first polysilicon layer, with openings in said first polysilicon layer, only exposing a portion of the top surface of said field oxide regions;

forming an insulator layer on said first polysilicon floating gate shape;

depositing a second polysilicon layer;

anisotropic etching of said second polysilicon layer, to create a polysilicon control gate structure;

anisotropic etching of said insulator layer, in regions not covered by said polysilicon control gate structure;

anisotropic etching of said first polysilicon floating gate shape, in regions not covered by said polysilicon control gate structure, to create a polysilicon floating gate structure, self-aligned to, and overlying, said polysilicon control gate structure; and forming source and drain regions.

2. The method of claim 1, wherein said gate insulator layer is silicon dioxide, thermally grown in an oxygen-stream ambient, at a temperature between about 825° to 875° C., to a thickness between about 75 to 125 Angstroms.

3. The method of claim 1, wherein said first polysilicon floating gate shape is formed from a first polysilicon layer, deposited using LPCVD procedures, to a thickness between about 1000 to 1600 Angstroms, and patterned using anisotropic RIE procedures, using $Cl_2$ as an etchant.

4. The method of claim 1, wherein said insulator layer, formed on said first polysilicon floating gate shape, is an ONO layer, ($SiO_2$—$Si_3N_4$—$SiO_2$), formed to a thickness between about 180 to 220 Angstroms.

5. The method of claim 1, wherein said second polysilicon layer is deposited using LPCVD procedures, to a thickness between about 1200 to 1800 Angstroms.

6. The method of claim 1, wherein said polysilicon control gate is formed via an anisotropic RIE procedure, using $Cl_2$ as an etchant for said second polysilicon layer.

7. The method of claim 1, wherein said polysilicon floating gate structure is formed via an anisotropic RIE procedure, using $Cl_2$ as an etchant, and using photoresist shape, used to define said polysilicon control gate structure, as a mask.

8. A method for forming a polysilicon floating gate structure, self-aligned to an overlying polysilicon control gate structure, for a non-volatile memory device, on a semiconductor substrate, comprising the steps of:

forming field oxide regions in said semiconductor substrate;

growing a silicon dioxide gate layer on regions of said semiconductor substrate, not covered by said field oxide regions;

depositing a continuous first polysilicon layer completely covering the semiconductor substrate;

patterning of said first polysilicon layer to create a first polysilicon floating gate shape, comprised of said first polysilicon layer, with openings in said first polysilicon layer, only exposing a portion of the top surface of said field oxide regions;

depositing an insulator layer on said polysilicon floating gate structure;

depositing a second polysilicon layer;

forming a photoresist shape on said second polysilicon layer;

anisotropic etching of said second polysilicon layer, using said photoresist shape as a mask, to create said polysilicon control gate structure;

anisotropic etching of said insulator layer, in regions not covered by said polysilicon control gate structure;

anisotropic etching of said first polysilicon floating gate shape, using said photoresist shape, on said second polysilicon layer as a mask, to create said polysilicon floating gate structure; and forming source and drain regions.

9. The method of claim 8, wherein said silicon dioxide gate layer is thermally grown, in an oxygen-steam ambient, at a temperature between about 825° to 875° C., to a thickness between about 75 to 125 Angstroms.

10. The method of claim 8, wherein said first polysilicon layer is deposited using LPCVD procedures, to a thickness between about 1000 to 1600 Angstroms.

11. The method of claim 8, wherein said first polysilicon floating gate shape is formed via an anisotropic RIE procedure, using $Cl_2$ as an etchant.

12. The method of claim 8, wherein said insulator layer is an ONO layer, ($SiO_2$—$Si_3N_4$—$SiO_2$), formed to a thickness between about 180 to 220 Angstroms.

13. The method of claim 8, wherein said second polysilicon layer is deposited using LPCVD procedures, to a thickness between about 1200 to 1800 Angstroms.

14. The method of claim 8, wherein said polysilicon control gate structure is formed from said second polysilicon layer, via an anisotropic RIE procedure, using $Cl_2$ as an etchant, and using said photoresist shape as a mask.

15. The method of claim 8, wherein said insulator layer is patterned via an anisotropic RIE procedure, using $CHF_3$ as an etchant, and using said photoresist shape as a mask.

16. The method of claim 8, wherein said polysilicon floating gate structure is formed from said first polysilicon floating gate shape, via an anisotropic RIE procedure, using $Cl_2$ as an etchant, and using said photoresist shape as a mask.

* * * * *